United States Patent
Liu et al.

(10) Patent No.: US 9,431,959 B2
(45) Date of Patent: Aug. 30, 2016

(54) CRYSTAL OSCILLATOR

(71) Applicant: SHANGHAI EASTSOFT MICROELECTRONICS CO., LTD., Shanghai (CN)

(72) Inventors: Ruijin Liu, Shanghai (CN); Xu Zhang, Shanghai (CN); Jingjing Tao, Shanghai (CN)

(73) Assignee: SHANGHAI EASTSOFT MICROELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 14/965,849

(22) Filed: Dec. 10, 2015

(65) Prior Publication Data

US 2016/0099682 A1 Apr. 7, 2016

Related U.S. Application Data

(63) Continuation of application No. PCT/CN2014/070111, filed on Jan. 3, 2014.

(30) Foreign Application Priority Data

Jun. 27, 2013 (CN) .......................... 2013 1 0264201

(51) Int. Cl.
*H03B 5/36* (2006.01)
*H03B 5/04* (2006.01)

(52) U.S. Cl.
CPC ................ *H03B 5/364* (2013.01); *H03B 5/04* (2013.01)

(58) Field of Classification Search
USPC ............................................ 331/116 FE, 158
See application file for complete search history.

(56) References Cited

U.S. PATENT DOCUMENTS

2011/0298556 A1 12/2011 Lin et al.
2012/0154066 A1* 6/2012 Kubota .................... H03B 5/06
331/116 FE

FOREIGN PATENT DOCUMENTS

CN 102006057 A 4/2011
CN 102981548 A 3/2013

OTHER PUBLICATIONS

International Search Report of corresponding international PCT application No. PCT/CN2014/070111, dated Mar. 27, 2014.

* cited by examiner

*Primary Examiner* — Joseph Chang
(74) *Attorney, Agent, or Firm* — J.C. Patents

(57) ABSTRACT

A crystal oscillator, including: a voltage stabilizing unit, a transconductance unit, a feedback resistor, a crystal resonator and at least two ground capacitors. The voltage stabilizing unit includes a current source and a first branch circuit including PMOS and NMOS connected in series, PMOS has its source connected to output of the current source, PMOS and NMOS have their gates connected to drains thereof, and NMOS has its source connected to ground. The transconductance unit includes a second branch circuit including PMOS and NMOS connected in series, PMOS has its source connected to output of the voltage stabilizing unit, PMOS and NMOS have their gates connected to input of the crystal resonator and one end of the resistor, and have their drains connected to output of the crystal resonator and another end of the resistor. The capacitors are connected to two ends of the crystal resonator respectively and ground.

12 Claims, 3 Drawing Sheets

CRYSTAL OSCILLATOR

CROSS-REFERENCE TO RELATED APPLICATIONS

This application is a continuation of International Application No. PCT/CN2014/070111, filed on Jan. 3, 2014, which claims priority to Chinese Patent Application No. 201310264201.8, filed on Jun. 27, 2013, all of which are hereby incorporated by reference in their entireties.

TECHNICAL FIELD

Embodiments of the present invention relate to integrated circuit technologies and, in particular, to a crystal oscillator.

BACKGROUND

With development of the integrated circuit (IC) industry, oscillators have become an indispensable part of an IC, and the oscillators may be categorized as resistance-capacitance (RC) oscillators, ceramic oscillators, crystal oscillators, etc. The crystal oscillator which serves as an electronic component used for stabilizing a frequency and selecting a frequency has been widely used in mobile phone carrier communications, broadcast television, satellite communications, atomic clocks, digital instruments, computer program controlled switches, VCDs, DVDs, railway signals and frequency signal source devices in a communication system, and may also be used as a temperature, pressure, or weight sensing element.

However, due to the fact that properties of a complementary metal-oxide semiconductor (CMOS), such as vibromotive condition and working voltage, are susceptible to the production process of the component and the temperature of working environment, when the production process of the CMOS component in the crystal oscillator changes or the temperature of working environment changes, relatively high power consumption may be required to guarantee a normal oscillation thereof, thus, the crystal oscillator in the prior art has higher power consumption.

SUMMARY

Embodiments of the present invention provide a crystal oscillator to solve the problem of high power consumption of the crystal oscillator in the prior art.

The present invention provides a crystal oscillator, including: a voltage stabilizing unit, a transconductance unit, a feedback resistor, a crystal resonator and at least two ground capacitors, where the voltage stabilizing unit includes: a current source and a first branch circuit, where the first branch circuit includes a P-type Metal-Oxide Semiconductor PMOS and an N-type Metal-Oxide Semiconductor NMOS successively connected in series, the PMOS of the first branch circuit has its source connected to an output of the current source; in the first branch circuit, the PMOS has its gate connected to a gate of the NMOS, the PMOS has its drain connected to a drain of the NMOS, the PMOS has its gate connected to the drain of the NMOS, and the NMOS has its source connected to ground;

the transconductance unit includes a second branch circuit, where the second branch circuit includes a PMOS and an NMOS successively connected in series; in the second branch circuit, the PMOS has its drain connected to a drain of the NMOS, the PMOS has its gate connected to the gate of the NMOS, the PMOS in the second branch circuit has its source connected to a voltage output of the voltage stabilizing unit;

the PMOS and the NMOS in the second branch circuit have their gates both connected to an input of the crystal resonator, and the PMOS and the NMOS in the second branch circuit have their drains both connected to an output of the crystal resonator;

the PMOS and the NMOS in the second branch circuit have their gates both connected to one end of the feedback resistor, and the PMOS and the NMOS in the second branch circuit have their drains both connected to another end of the feedback resistor; and the at least two ground capacitors are connected to two ends of the crystal resonator respectively and are connected to ground.

A crystal oscillator according to the present invention provides a voltage which is able to vary with production processes of a PMOS component and an NMOS component adaptively by means of a current output from a current source in a voltage stabilizing unit passing through the PMOS and the NMOS successively connected in series, so that the voltage output from the voltage stabilizing unit can be regulated automatically, when a process changes and an environment temperature changes, a proper working voltage can be provided to the crystal oscillator to enable the crystal oscillator to always work within the sub-threshold range, thereby reducing power consumption of the crystal oscillator.

DESCRIPTION OF EMBODIMENTS

Power consumption of a crystal oscillator is closely related to the working voltage of the crystal oscillator. If the working voltage of a transconductance unit of the crystal oscillator is maintained at about Vthp+Vthn, that is, making the P-type metal-oxide semiconductor (PMOS) and the N-type metal-oxide semiconductor (NMOS) in the transconductance unit work within a sub-threshold range, and if a normal operation of the crystal oscillator can be maintained, then the power consumption of the crystal oscillator may be reduced to a very low value, where Vthp is a working voltage threshold of the PMOS, and Vthn is a working voltage threshold of the NMOS. For instance, for a crystal oscillator for 32 KHz, if it is maintained to work within the sub-threshold range, its power consumption will be several hundreds of nanoamps (nA). If the crystal oscillator does not work within the sub-threshold range, then its power consumption will be higher.

Figure 1:
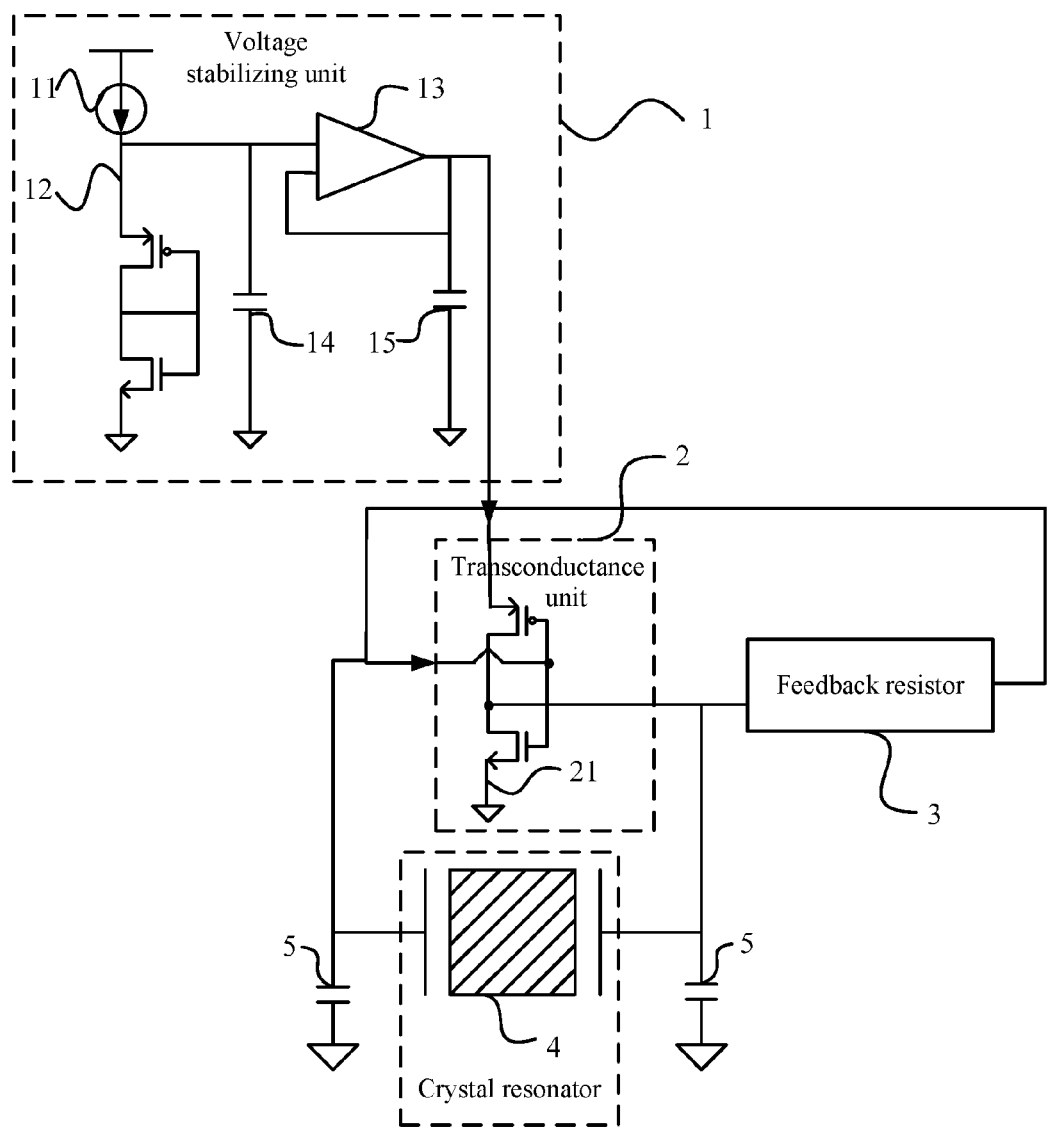
FIG. 1 is a schematic structural diagram of a crystal oscillator according to embodiment 1 of the present invention.

FIG. 1 is a schematic structural diagram of a crystal oscillator according to embodiment 1 of the present invention. As shown in FIG. 1, the crystal oscillator in this embodiment may include: a voltage stabilizing unit 1, a transconductance unit 2, a feedback resistor 3, a crystal resonator 4 and two ground capacitors 5, where the voltage stabilizing unit 1 is configured to provide a working voltage, the transconductance unit 2 is configured to provide a changed and amplified current according to a change of the voltage, the feedback resistor 3 is configured to provide a stable working point, and the crystal resonator 4 and the two ground capacitors 5 constitute a frequency selecting component.

The voltage stabilizing unit 1 may include: a current source 11 and a first branch circuit 12, where the first branch circuit 12 includes a PMOS and an NMOS successively connected in series, the PMOS of the first branch circuit 12 has its source connected to an output of the current source 11; in the first branch circuit, the PMOS has its gate connected to a gate of the NMOS, the PMOS has its drain connected to a drain of the NMOS, the PMOS has its gate connected to the drain of the NMOS, and the NMOS has its source connected to ground.

The transconductance unit 2 may include a second branch circuit 21, where the second branch circuit 21 includes a PMOS and an NMOS successively connected in series; in the second branch circuit, the PMOS has its drain connected to a drain of the NMOS, the PMOS has its gate connected to a gate of the NMOS, and the PMOS in the second branch circuit has its source connected to a voltage output of the voltage stabilizing unit 1.

The PMOS and the NMOS in the second branch circuit 21 have their gates both connected to an input of the crystal resonator 4, and the PMOS and the NMOS in the second branch circuit 21 have their drains both connected to an output of the crystal resonator 4. Specifically, both the gate of the PMOS and the gate of the NMOS in the second branch circuit 21 may be connected to a positive pin of the crystal resonator 4, and both the drain of the PMOS and the drain of the NMOS in the second branch circuit 21 may be connected to a negative pin of the crystal resonator 4. The voltage output from the voltage stabilizing unit 1 is added to the source of the PMOS in the second branch circuit 21 of the transconductance unit 2.

The PMOS and the NMOS in the second branch circuit 21 have their gates both connected to one end of the feedback resistor 3, and the PMOS and the NMOS in the second branch circuit 21 have their drains both connected to another end of the feedback resistor 3.

The at least two ground capacitors 5 are connected to two ends of the crystal resonator 4 respectively and are connected to ground.

More specifically, the voltage stabilizing unit 1 may specifically include: the current source 11, the first branch circuit 12, an amplifier 13, a voltage stabilizing capacitor 14 and a phase compensated capacitor 15.

A first input of the amplifier 13 may be connected to the source of the PMOS in the first branch circuit 12, and connected to the output of the current source 11. A second input of the amplifier 13 is connected to an output of the amplifier 13, and is connected to a first end of the phase compensated capacitor 15.

The output of the amplifier 13 is further connected to the source of the PMOS of the transconductance unit 2.

A first end of the voltage stabilizing capacitor 14 may be connected to the first input of the amplifier 13.

A second end of the voltage stabilizing capacitor 14 and a second end of the phase compensated capacitor 15 are both connected to ground.

The minimum voltage required by the crystal oscillator for generation of stable oscillation is related to the temperature of working environment of the CMOS and the production process of the CMOS. When the temperature of working environment of the CMOS or the production process of the CMOS changes, the minimum voltage required by the crystal oscillator for oscillation will also change.

A voltage stabilizing source of a crystal oscillator in the prior art can only output a fixed voltage generally, or a voltage output from the voltage stabilizing source can only be manually adjusted, and the voltage output therefrom cannot be automatically adjusted when the temperature of working environment of the CMOS or the production process of the CMOS changes, thus the power consumption is relatively high.

In this embodiment, the first branch circuit 12 included in the voltage stabilizing unit 1 includes the PMOS and the NMOS successively connected in series, and the connection mode that successively connected in series thereof is consistent with that of the PMOS and the NMOS which are included in the second branch circuit 21 of the transconductance unit 2. Therefore, when the temperature of working environment of the crystal oscillator changes, a voltage generated by means of a current output from the current source 11 passing through the PMOS and the NMOS successively connected in series in the first branch circuit 12 will also change, and the changing tendency thereof is consistent with that of the PMOS and the NMOS successively connected in series in the second branch circuit 21 of the transconductance unit 2. Moreover, in this embodiment, since the second input of the amplifier 13 is connected to the output of the amplifier 13, the function of the amplifier 13 is equivalent to a follower, thus, after the voltage output from the first branch circuit 12 passes through the amplifier 13 which is equivalent to the follower, the changing tendency of the voltage which changes with the temperature of working environment does not change. Likewise, the changing tendency of the voltage corrected via the voltage stabilizing capacitor 14 and the phase compensated capacitor 15 will not change either, thereby guaranteeing that the voltage output from the voltage stabilizing unit 1 changes synchronously with the temperature of working environment.

Furthermore, all CMOS components included in the crystal oscillator according to this embodiment may use components produced under the same production process, which guarantees that the PMOS and the NMOS in the voltage stabilizing unit 1 have a deviation direction of properties consistent with that of the PMOS and the NMOS in the transconductance unit 2, the change of the working voltage is consistent with the changing tendency of a threshold voltage.

The crystal oscillator in this embodiment provides a voltage which is able to adaptively vary with the temperature of working environment and production processes of the PMOS component and the NMOS component by means of the current output from the current source in the voltage stabilizing unit passing through the PMOS and the NMOS successively connected in series, so that the voltage output from the voltage stabilizing unit can be adjusted automatically according to the production processes and the temperature, and a case is satisfied where a proper working voltage can be provided to enable the crystal oscillator to always work within a sub-threshold range, even when working conditions of the crystal oscillator are changed, thereby reducing power consumption of the crystal oscillator.

Figure 2:
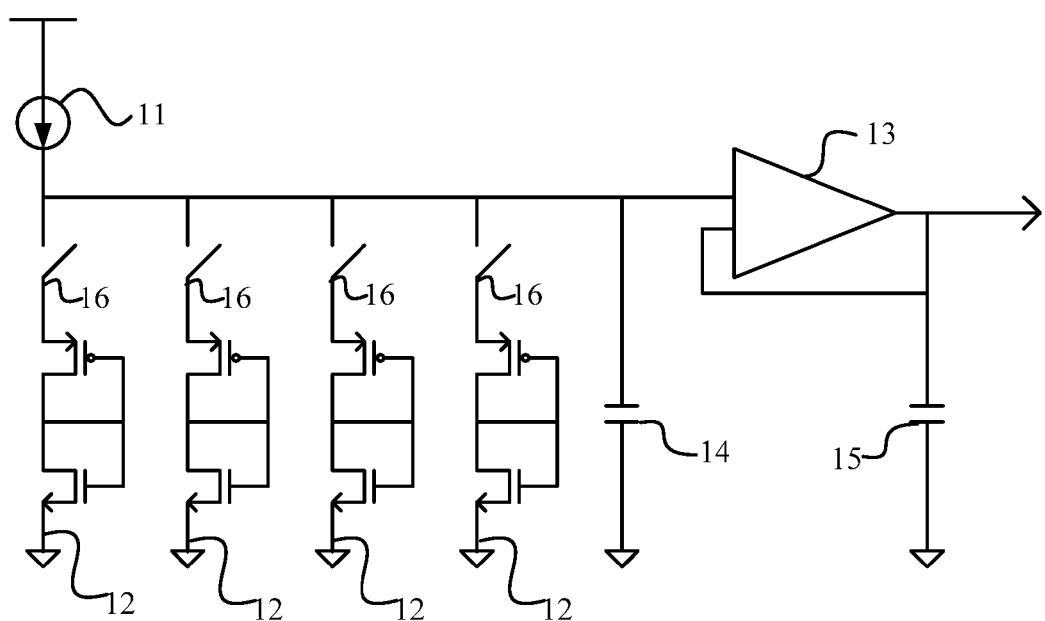
FIG. 2 is a schematic structural diagram of a voltage stabilizing unit in the crystal oscillator according to embodiment 1 of the present invention.

Furthermore, in the crystal oscillator according to the above embodiment, the number of the first branch circuits 12 in the voltage stabilizing unit 1 may be M, where M may be an integer larger than or equal to 1. FIG. 2 is a schematic structural diagram of a voltage stabilizing unit in the crystal oscillator according to embodiment 1 of the present invention, and FIG. 2 is described by taking an example where M is 4. As shown in FIG. 2, the respective first branch circuits 12 may be connected in parallel; and the voltage stabilizing unit may also include switches 16, each of which is used to control each of the first branch circuits. For the crystal oscillator in this embodiment, besides the voltage stabilizing unit 1 using the structure as shown in FIG. 2, other components may use a same structure as that of the crystal oscillator in the embodiment as shown in FIG. 1, and the connection mode thereof may be the same as that of the crystal oscillator in the embodiment as shown in FIG. 1.

Further, the PMOS in the respective first branch circuit 12 may have a different dimension from the PMOSs in other first branch circuits 12; and the NMOS in the respective first branch circuit 12 may have a different dimension from the NMOSs in other first branch circuits 12. Thus, the voltage output from the voltage stabilizing unit 1 is different for each first branch circuit when controlled to be connected, and then more grades of output voltages may be provided via a combination of respective switches. For instance, it may be provided that, a ratio of the width to the length of the PMOS and the NMOS in each first branch circuit is respectively twice a ratio of the width to the length of the PMOS and the NMOS in a previous first branch circuit. For the voltage stabilizing unit of which M is 4, in a case where the current provided by the current source does not change, 15 grades of voltages may be provided.

The crystal oscillator in this embodiment provides a plurality of different voltage grades by means of including a plurality of first branch circuits in the voltage stabilizing unit; which, furthermore, enables to provide different output voltages when respective first branch circuits are connected respectively, by means of setting different dimensions of CMOSs in the respective first branch circuits, and enables to provide more voltage grades by means of flexibly using switches, thereby increasing flexibility of a crystal oscillator circuit.

Figure 3:
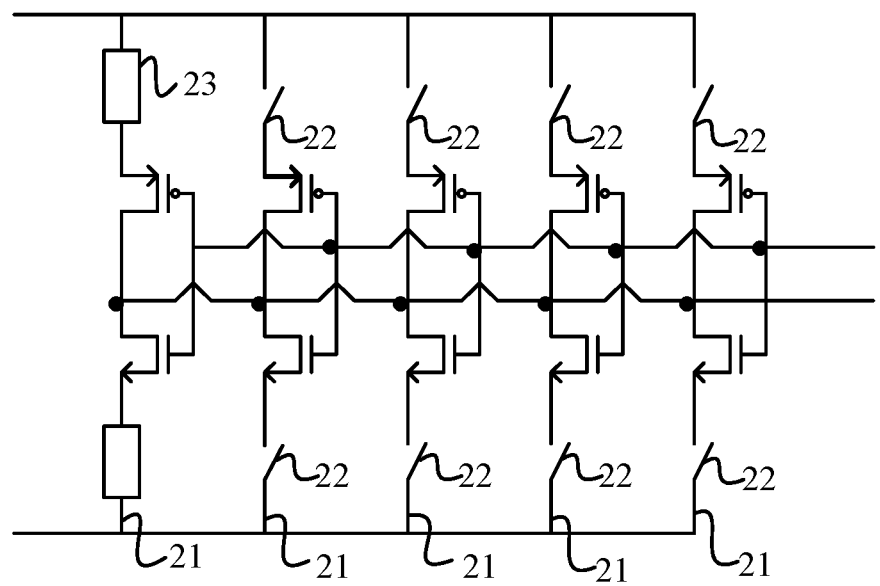
FIG. 3 is a schematic structural diagram of a transconductance unit in the crystal oscillator according to embodiment 1 of the present invention.

FIG. 3 is a schematic structural diagram of a transconductance unit in the crystal oscillator according to embodiment 1 of the present invention As shown in FIG. 3, the number of the second branch circuits 21 in the transconductance unit 2 may be N, where N may be an integer larger than or equal to 1. FIG. 3 is described by taking an example where N equals to 5. The respective second branch circuits 21 may be connected in parallel; and the transconductance unit 2 also includes switches 22, each of which is used to control each of the second branch circuits 21. For the crystal oscillator in this embodiment, besides the voltage stabilizing unit 1 using the structure as shown in FIG. 2, other components may use a same structure as that of the crystal oscillator in the embodiment as shown in FIG. 1 or FIG. 2, and the connection mode thereof may also be the same as that of the crystal oscillator in the embodiment as shown in FIG. 1 or FIG. 2.

Because a frequency range that can be achieved by the crystal oscillator is closely related to the dimension of the transconductance unit, for a transconductance unit with a fixed transconductance value, only a smaller frequency range can be achieved by the crystal oscillator. In this embodiment, the form of a plurality of second branch circuits is employed, and transconductance values of the transconductances formed by PMOSs and NMOSs in respective second branch circuits are different, so as to meet requirements of different frequencies. The frequency range of the crystal oscillator may be expanded by controlling a switch in each second branch circuit 21, as long as transconductance values in respective second branch circuits 21 are selected properly, a full-band frequency range of 32 KHz-30 MHz may be achieved. For instance, in order to make an oscillation frequency as 32 KHz, a transconductance value may be set to 10 uS (microsiemens); in order to make an oscillation frequency as 20 MHz, a transconductance value may be set to 1 mS (millisiemens). Thus, when the frequency of the crystal oscillator changes from lower to higher, switches in the transconductance unit 2 as shown in FIG. 3 are closed successively, a transconductance value of the entire circuit may be enlarged gradually to meet requirements of various different oscillation frequencies, so as to guarantee a property of stable oscillation for the crystal oscillator.

Further, in the crystal oscillator of this embodiment, the transconductance unit 2 may also include a current limiting resistor 23, and the current limiting resistor 23 may undergo series connection in a certain or some second branch circuits 21. This is mainly for a case of low frequency, such as a frequency band of 32 KHz-200 KHz, where generally the peak current is relatively high, the current limiting resistor 23 may be added in a part of second branch circuits to reduce the peak current and reduce power consumption of the crystal oscillator.

Figure 4:
FIG. 4 is a schematic structural diagram of a feedback resistor in the crystal oscillator according to embodiment 1 of the present invention.

Further, in the crystal oscillator of this embodiment, the feedback resistor 3 may be designed into a form having an adjustable resistance value. This is because, when the frequency of the crystal oscillator changes, the resistance value of the feedback resistor 3 also needs to change. Generally, for a case where the frequency is raised from 32 KHz to 30 MHz, the resistance value of the feedback resistor needs to be reduced from 20M ohms to 100K ohms, therefore, requirements of a frequency change can be satisfied by adopting the feedback resistor 3 in the form having the adjustable resistance value. FIG. 4 is a schematic structural diagram of a feedback resistor in the crystal oscillator according to embodiment 1 of the present invention As shown in FIG. 4, the feedback resistor 3 may be formed by a plurality of resistors connected in series, and a switch connected in parallel is provided for a part of all of the plurality of resistors respectively according to the resistance value which needs to be adjusted, then the resistance value is adjusted by means of closing switches one by one, thereby achieving flexible adjustment to the resistance value of the feedback resistor.

This embodiment enables the crystal oscillator to achieve an ultra wide frequency range and meet requirements of various frequencies by means of using the transconductance unit including a plurality of second branch circuits, and controlling the transconductance value of the transconductance unit via the switch; enables the reduction of peak resistance, reduction of the peak current and reduction of power consumption of the crystal oscillator when the crystal oscillator works at a low frequency, by means of providing the current limiting resistor in a second branch circuit corresponding to the low frequency in the transconductance unit; and further guarantees stable oscillation of the crystal oscillator in the ultra wide frequency range by means of using a resistance adjustable feedback resistor to meet requirements of various frequencies.

Finally, it should be noted that the foregoing embodiments are merely intended for describing technical solutions of the present invention rather than limiting the present invention. Although the present invention is described in detail with reference to the foregoing embodiments, persons of ordinary skill in the art should understand that they may still make modifications to the technical solutions described in the foregoing embodiments, or make equivalent replacements to some or all technical features therein; however, these modifications or replacements do not make the essence of corresponding technical solutions depart from the scope of the technical solutions in the embodiments of the present invention.

What is claimed is:

1. A crystal oscillator, comprising: a voltage stabilizing unit, a transconductance unit, a feedback resistor, a crystal resonator and at least two ground capacitors, wherein
   the voltage stabilizing unit comprises: a current source, M first branch circuits and M switches wherein
   M is an integer larger than 1, the first branch circuits are connected to each other in parallel and each of the first branch circuits is controlled by one of the switches respectively;
   each of the first branch circuit comprises a P-type Metal-Oxide Semiconductor (PMOS) and an N-type Metal-Oxide Semiconductor (NMOS) successively connected in series,; in each of the first branch circuit, the PMOS has its gate connected to a gate of the NMOS, the PMOS has its drain connected to a drain of the NMOS, the PMOS has its gate connected to the drain of the NMOS, and the NMOS has its source connected to ground;
   the transconductance unit comprises a second branch circuit, wherein the second branch circuit comprises a PMOS and an NMOS successively connected in series; in the second branch circuit, the PMOS has its drain connected to a drain of the NMOS, the PMOS has its gate connected to a gate of the NMOS, the PMOS in the second branch circuit has its source connected to a voltage output of the voltage stabilizing unit;
   the PMOS and the NMOS in the second branch circuit have their gates both connected to an input of the crystal resonator, and the PMOS and the NMOS in the second branch circuit have their drains both connected to an output of the crystal resonator;
   the PMOS and the NMOS in the second branch circuit have their gates both connected to one end of the feedback resistor, and the PMOS and the NMOS in the second branch circuit have their drains both connected to another end of the feedback resistor; and
   the at least two ground capacitors are connected to two ends of the crystal resonator respectively and are connected to ground.

2. The crystal oscillator according to claim 1, wherein the voltage stabilizing unit specifically comprises: the current source, the first branch circuit, an amplifier, a voltage stabilizing capacitor and a phase compensated capacitor, wherein
   a first input of the amplifier is connected to the source of the PMOS in the first branch circuit, and is connected to the output of the current source, a second input of the amplifier is connected to an output of the amplifier, and is connected to a first end of the phase compensated capacitor;
   the output of the amplifier is connected to the source of the PMOS in the second branch circuit of the transconductance unit;
   a first end of the voltage stabilizing capacitor is connected to the first input of the amplifier; and
   a second end of the voltage stabilizing capacitor and a second end of the phase compensated capacitor are both connected to ground.

3. The crystal oscillator according to claim 1, wherein the PMOS in the respective first branch circuit has a different dimension from the PMOSs in other first branch circuits; and the NMOS in the respective first branch circuit has a different dimension from NMOSs in other first branch circuits.

4. The crystal oscillator according to claim 2, wherein the PMOS in the respective first branch circuit has a different dimension from the PMOSs in other first branch circuits; and the NMOS in the respective first branch circuit has a different dimension from NMOSs in other first branch circuits.

5. The crystal oscillator according to claim 1, wherein there are N second branch circuits, N is an integer larger than or equal to 1, the respective second branch circuits are connected in parallel; and the transconductance unit further comprises switches, each of which is used to control each of the second branch circuits.

6. The crystal oscillator according to claim 5, wherein the transconductance unit further comprises at least one current limiting resistor, each of which undergoes series connection in each of the second branch circuits.

7. The crystal oscillator according to claim 2, wherein there are N second branch circuits, N is an integer larger than or equal to 1, the respective second branch circuits are connected in parallel; and the transconductance unit further comprises switches, each of which is used to control each of the second branch circuits.

8. The crystal oscillator according to claim 7, wherein the transconductance unit further comprises at least one current limiting resistor, each of which undergoes series connection in each of the second branch circuits.

9. The crystal oscillator according to claim 1, wherein the feedback resistor has an adjustable resistance value.

10. The crystal oscillator according to claim 9, wherein the feedback resistor is formed by a plurality of resistors connected in series, and a switch connected in parallel is provided for a part or all of the plurality of resistors respectively according to a resistance value to be adjusted.

11. The crystal oscillator according to claim 1, wherein one end of each of the first branch circuits is connected to ground and the other end of each of the first branch circuits is connected to the output of the current source.

12. The crystal oscillator according to claim 1, wherein one end of each of the switches is connected to the output of the current source and the other end of each of the switches is connected to the source of the PMOS of each of the first branch circuit.

* * * * *